(12) United States Patent
Cheng et al.

(10) Patent No.: US 8,090,900 B2
(45) Date of Patent: Jan. 3, 2012

(54) STORAGE DEVICE AND DATA MANAGEMENT METHOD

(75) Inventors: Wei-Te Cheng, Taipei Hsien (TW); Rong-Hua Kung, Taipei Hsien (TW)

(73) Assignee: Apacer Technology Inc., Taipei Hsien (TW)

( * ) Notice: Subject to any disclaimer, the term of this patent is extended or adjusted under 35 U.S.C. 154(b) by 253 days.

(21) Appl. No.: 12/630,338

(22) Filed: Dec. 3, 2009

(65) Prior Publication Data
US 2010/0146194 A1 Jun. 10, 2010

(30) Foreign Application Priority Data
Dec. 5, 2008 (TW) ................................ 97147461 A

(51) Int. Cl.
*G06F 12/00* (2006.01)
(52) U.S. Cl. ........................................ 711/103
(58) Field of Classification Search .................. None
See application file for complete search history.

(56) References Cited

U.S. PATENT DOCUMENTS

| | | | | |
|---|---|---|---|---|
| 5,799,168 A | * | 8/1998 | Ban ............................. | 711/103 |
| 7,757,037 B2 | * | 7/2010 | Chen ............................ | 711/103 |
| 2005/0160218 A1 | * | 7/2005 | See et al. ..................... | 711/103 |
| 2008/0209114 A1 | | 8/2008 | Chow et al. | |
| 2009/0287876 A1 | * | 11/2009 | Yeh .............................. | 711/103 |
| 2009/0300273 A1 | * | 12/2009 | Chen et al. ................... | 711/103 |
| 2010/0042774 A1 | * | 2/2010 | Yang et al. .................... | 711/103 |
| 2010/0125694 A1 | * | 5/2010 | Choi ............................ | 711/1 |
| 2010/0262759 A1 | * | 10/2010 | Borchers et al. .............. | 711/103 |

FOREIGN PATENT DOCUMENTS

CN 1620700 5/2005

* cited by examiner

*Primary Examiner* — Hiep Nguyen
(74) *Attorney, Agent, or Firm* — Hunton & Williams LLP

(57) ABSTRACT

A storage device includes two flash memories of different flash memory types, and respectively including multiple data blocks. Each data block corresponds to a physical and a logical block address. The storage device further includes a processing module including a controller, which is capable of accessing two mapping tables respectively corresponding to the two flash memories and respectively recording the physical block addresses and the logical block addresses that correspond to the data blocks of the two flash memories. The controller is configured to determine, upon receipt of a command that contains a target logical block address therein, a selected one of the flash memories according to the target logical block address, and to locate a selected one of the physical block addresses by searching one of the mapping tables that corresponds to the selected one of the flash memories with reference to the target logical block address.

13 Claims, 7 Drawing Sheets

STORAGE DEVICE AND DATA MANAGEMENT METHOD

CROSS-REFERENCE TO RELATED APPLICATION

This application claims priority of Taiwanese Application No. 097147461, filed on Dec. 5, 2008.

BACKGROUND OF THE INVENTION

1. Field of the Invention

The invention relates to a data management method, more particularly to a data management method for a storage device that includes multiple types of flash memories.

2. Description of the Related Art

A solid-state drive (SSD), which utilizes the flash memory technology, has the advantages of having fast access speed, low power consumption, lightweight, etc., when compared to a conventional hard disk. Currently, it is common for the flash memory to be used in USB drives, memory cards, mobile phones, notebook computers, etc.

At present, a flash memory used by a solid-state drive utilizes a floating gate transistor for data storage. There are single-level cell (SLC) type flash memories and multi-level cell (MLC) type flash memories, which differ in storage capacity of each cell in the flash memory. The SLC type flash memory stores one bit of data in each memory cell. On the other hand, the MLC type flash memory is currently capable of storing two bits of information in each memory cell. The MLC type flash memory, as compared to the SLC type flash memory, has the advantages of being cheaper and having a greater storage capacity. On the other hand, the SLC type flash memory, as compared to the MLC type flash memory, has higher stability, faster access speed (approximately 2 to 3 times of that of the MLC type flash memory), and a longer service life (i.e., permitting a total number of times that data has been erased from each memory cell that is approximately 10 times that of the MLC type flash memory).

In order to possess the advantages of both the faster access speed and longer service life of the SLC type flash memory and the lower cost and larger storage capacity of the MLC type flash memory, a hybrid solid-state drive that incorporates both the SLC type flash memory and the MLC type flash memory has been developed. However, current data management techniques, such as those disclosed in Taiwanese Patent No. I293729 and Taiwanese Patent Publication No. 200705180, do not take into consideration the differences in characteristics between different types of flash memories in a single storage device. Therefore, how to effectively manage data in a storage device that includes different types of flash memories so as to truly utilize the advantages of the different types of flash memories is a very important subject in the relevant art.

SUMMARY OF THE INVENTION

Therefore, the object of the present invention is to provide a data management method for a storage device that includes at least two types of flash memories to effectively manage operating efficiency of the storage device.

Another object of the present invention is to provide a storage device that includes at least two types of flash memories and that has good operating efficiency.

According to one aspect of the present invention, there is provided a storage device that includes a first flash memory, a second flash memory, and a processing module. The first flash memory is a first flash memory type, and includes a first number of data blocks. The first number is a positive integer that is greater than one. The second flash memory is a second flash memory type that is different from the first flash memory type, and includes a second number of data blocks. The second number is a positive integer that is greater than one. Each of the data blocks of the first and second flash memories corresponds to a physical block address and a logical block address. The processing module includes a controller capable of accessing a first mapping table and a second mapping table. The first mapping table corresponds to the first flash memory, and records the physical block addresses and the logical block addresses that correspond to the data blocks of the first flash memory. The second mapping table corresponds to the second flash memory, and records the physical block addresses and the logical block addresses that correspond to the data blocks of the second flash memory. The controller of the processing module is configured to determine, upon receipt of a command that contains a target logical block address therein, a selected one of the first and second flash memories according to the target logical block address, and to locate a selected one of the physical block addresses by searching one of the first and second mapping tables that corresponds to the selected one of the first and second flash memories with reference to the target logical block address.

The storage device of the present invention may be, for instance, a solid-state drive (SSD) that is to be installed in a notebook computer, a mobile phone, or that is to serve as a mobile drive. The first and second flash memories may respectively be a single-level cell (SLC) type flash memory, and a multi-level cell (MLC) type flash memory. Each of the data blocks of the first flash memory includes a plurality of first memory cells. Each of the data blocks of the second flash memory includes a plurality of second memory cells. A memory capacity of each of the first memory cells is different from that of each of the second memory cells.

Preferably, the controller is further configured to keep track, for each of the data blocks of each of the first and second flash memories, of a total number of times that data has been erased therefrom. When the command is a write command that contains the target logical block address and a write data, the controller is configured to determine whether the data block in the selected one of the flash memories and corresponding to the physical block address is a suitable data block according to a wear-leveling algorithm, and is further configured to find from within the selected one of the first and second flash memories as determined according to the target logical block address in the command, a selected available one of the data blocks according to the wear-leveling algorithm with reference to the total number of times that data has been erased from each of the data blocks in the event that the data block corresponding to the physical block address is not a suitable data block. In addition, the controller is further configured to write the write data into the selected available one of the data blocks, and to set, in the selected one of the first and second mapping tables, the physical block address of the selected available one of the data blocks to correspond to the target logical block address in the command.

When the command is a read command, the controller is configured to read data from the data block in the selected one of the flash memories and corresponding to the physical block address thus located.

The storage device of the present invention may include more than two flash memories. There is also a mapping table corresponding to each addition flash memory. The basic principles of data managing are the same as the above.

According to another aspect of the present invention, there is provided a data management method for a storage device. The data management method includes the steps of:

(a) upon receipt of a write command that contains a target logical block address and a write data, configuring a controller to determine a selected one of a plurality of flash memories of the storage device according to the target logical block address;

(b) configuring the controller to find a selected one of a plurality of mapping tables that corresponds to the selected one of the flash memories, each of the mapping tables indicating corresponding relationships between a physical block address and a logical block address of each of a plurality of data blocks in the corresponding one of the flash memories;

(c) configuring the controller to locate the physical block address that corresponds to the target logical block address by searching the selected one of the mapping table thus found in step (b); and (d) configuring the controller to store the write data into the data block in the selected one of the flash memories and corresponding to the physical block address thus located in step (c).

Preferably, the data management method further includes the step of, prior to step (a): (e) configuring the controller to establish each of the mapping tables. In step (e), the controller is configured to establish each of the mapping tables by reading and storing initial values of the physical block address and the logical block address that are stored in each of the data blocks in the corresponding one of the flash memories.

Preferably, the data management method further includes the step of configuring the controller to keep track, for each of the data blocks of each of the flash memories, of the total number of times that data has been erased therefrom, and to store the total number of times to correspond to the physical block address and the logical block address of the corresponding one of the data blocks of the corresponding one of the flash memories in the corresponding one of the mapping tables. The data management method further includes the step of, between step (c) and step (d): (f) configuring the controller to determine whether the data block in the selected one of the flash memories and corresponding to the physical block address thus located in step (c) is a suitable data block according to a wear-leveling algorithm. Step (d) is only performed when it is determined in step (f) that the data block in the selected one of the flash memories and corresponding to the physical block address thus located in step (c) is a suitable data block. The data management method further includes the steps of: (g) when it is determined in step (f) that the data block in the selected one of the flash memories and corresponding to the physical block address thus located in step (c) is not a suitable data block, configuring the controller to find, from within the selected one of the first and second flash memories, a selected available one of said data blocks according to the wear-leveling algorithm with reference to a total number of times that data has been erased from each of the data blocks; and (h) configuring the controller to write the write data into the selected available one of the data blocks, and to set, in the selected one of the mapping tables, the physical block address of the selected available one of the data blocks to correspond to the target logical block address in the write command.

According to yet another aspect of the present invention, there is provided a data management method for a storage device. The data management method includes the steps of:

(a) upon receipt of a read command that contains a target logical block address, configuring a controller to determine a selected one of a plurality of flash memories of the storage device according to the target logical block address;

(b) configuring the controller to find a selected one of a plurality of mapping tables that corresponds to the selected one of the flash memories, each of the mapping tables indicating relationships between a physical block address and a logical block address of each of a plurality of data blocks in the corresponding one of the flash memories;

(c) configuring the controller to locate the physical block address that corresponds to the target logical block address by searching the mapping table thus found in step (b); and (d) configuring the controller to read data from the data block in the selected one of the flash memories and corresponding to the physical block address thus located in step (c).

The present invention utilizes individual mapping tables for managing different types of flash memories of a storage device such that data to be written into the storage device is stored in a data block having a physical block address that corresponds to a target logical block address. As compared with conventional data management techniques, due to the use of a single mapping table for a corresponding single flash memory in the storage device, the present invention takes into consideration the differences among the flash memories such that data corresponding to a single file is written into one of the flash memories in the storage device, instead of being distributed among the different flash memories of different types and with different characteristics, such as access speed, so as to ensure good operating efficiency of the storage device.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
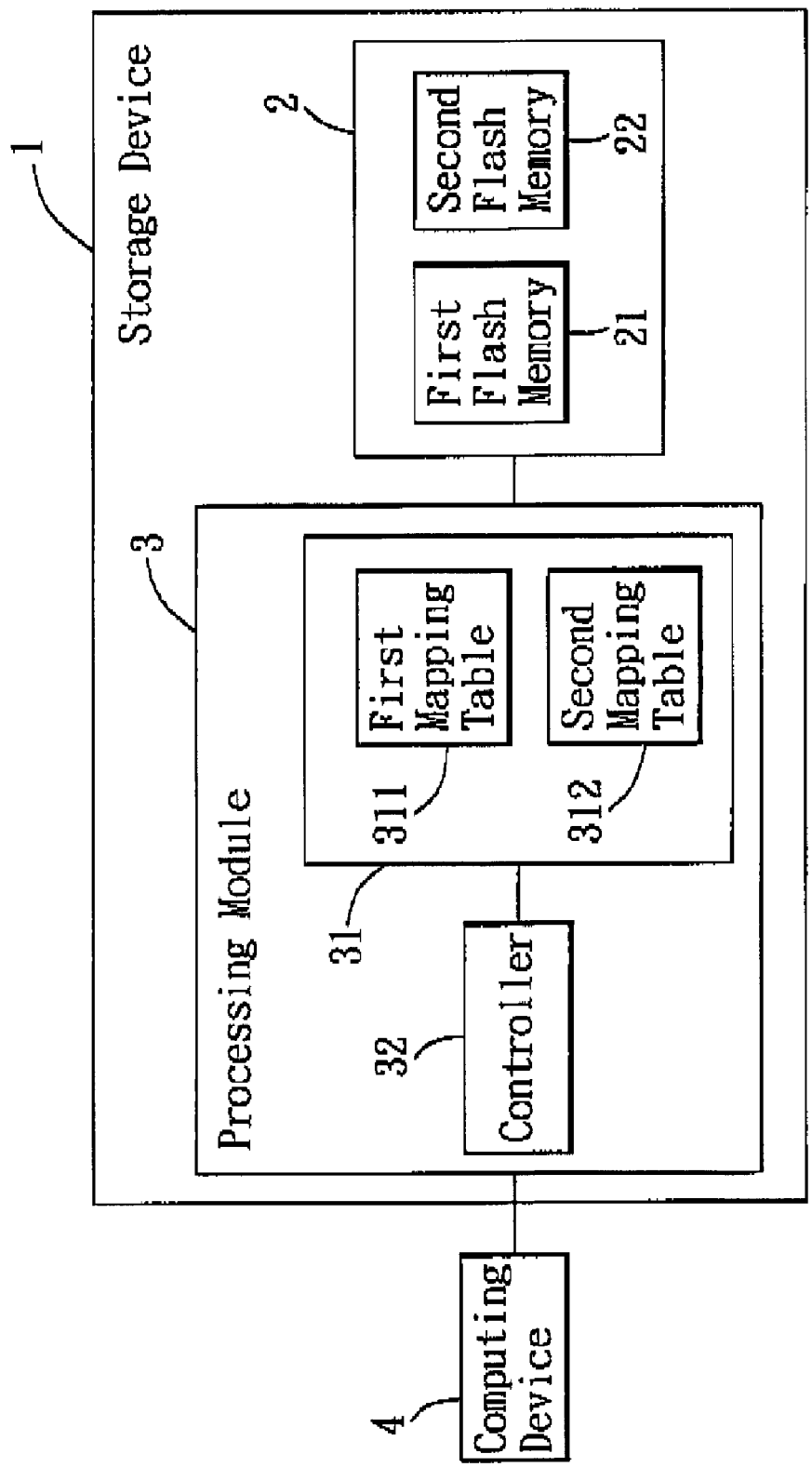
FIG. 1 is a block diagram of a storage device according to the first preferred embodiment of the present invention.

Before the present invention is described in greater detail with reference to the accompanying preferred embodiments, it should be noted herein that like elements are denoted by the same reference numerals throughout the disclosure.

Figure 2:
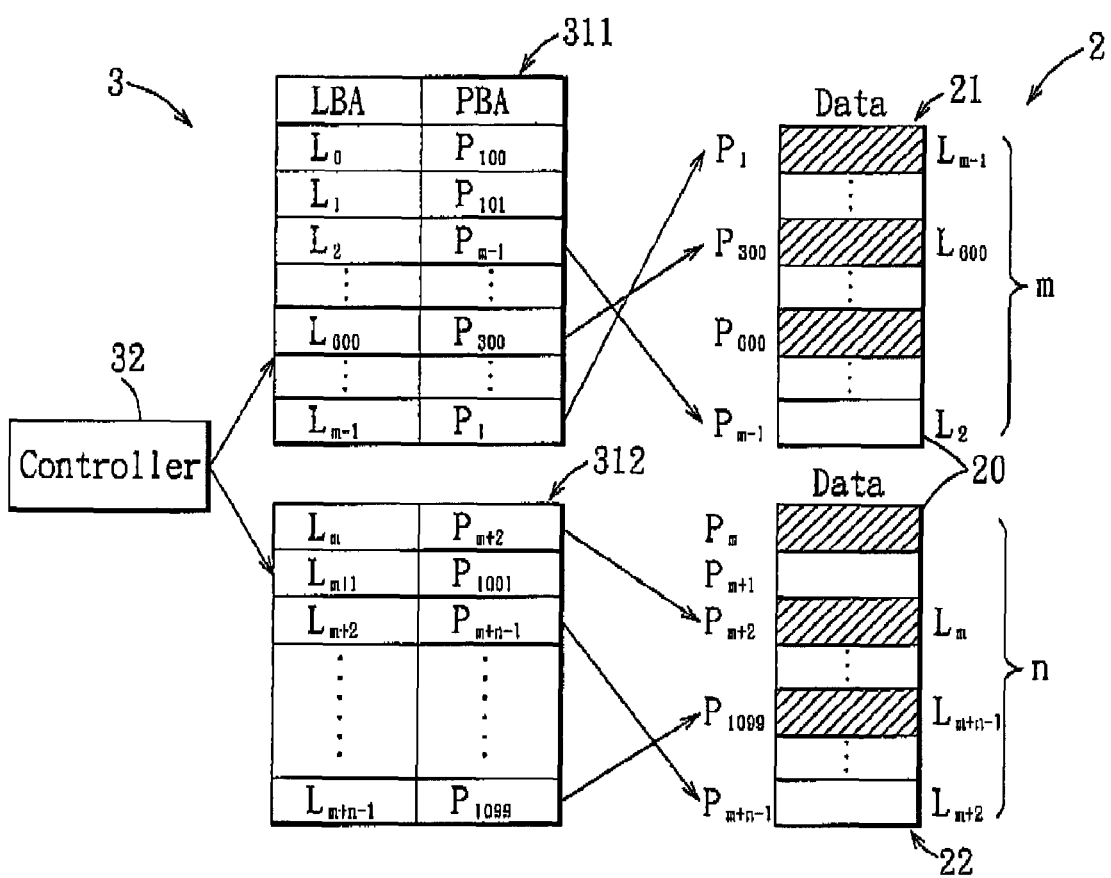
FIG. 2 is a schematic diagram for illustrating corresponding relationships between first and second mapping tables and first and second flash memories of the storage device according to the first preferred embodiment.
Figure 3A:
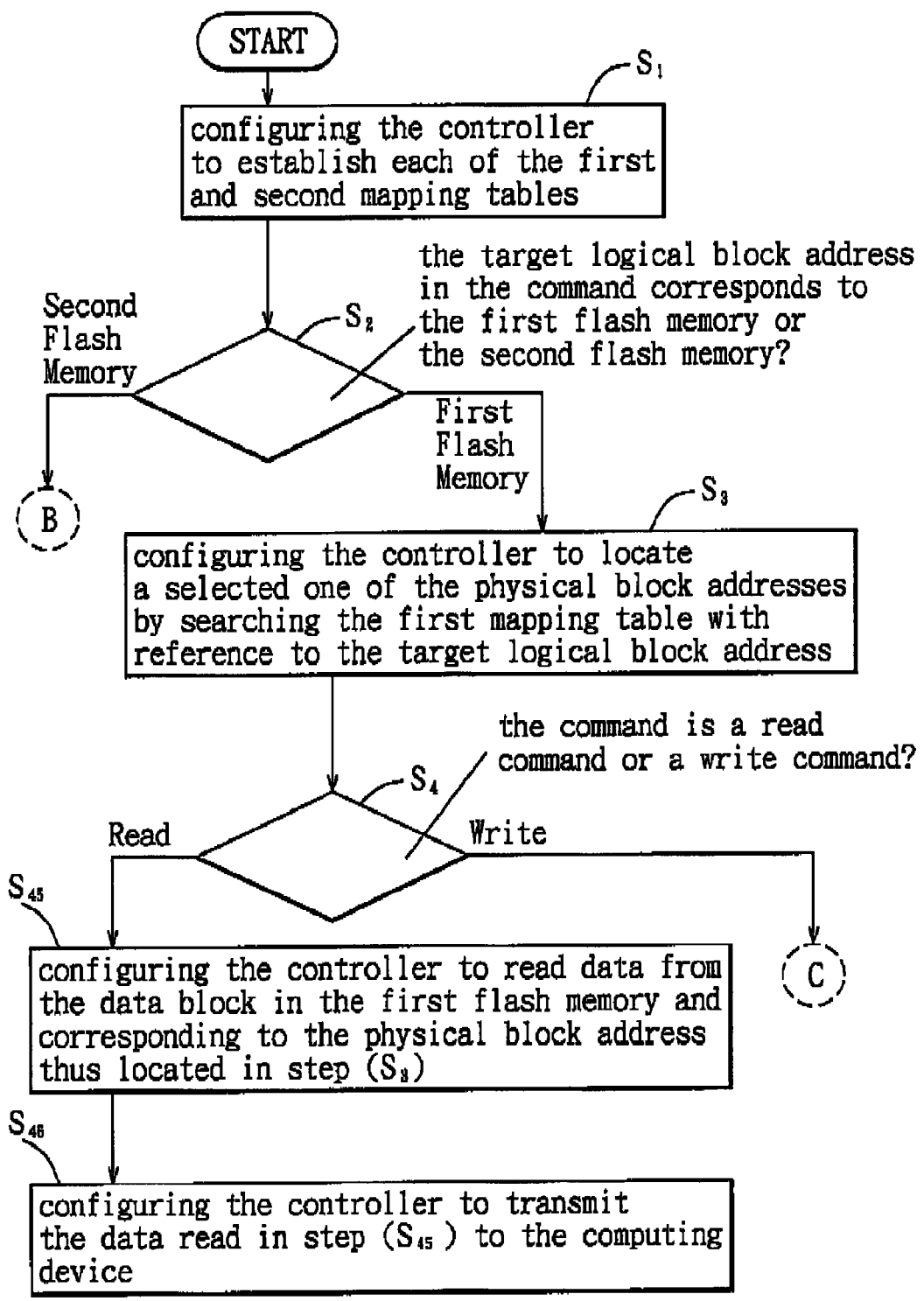
FIG. 3A and FIG. 3D are flowchart diagrams, illustrating process flow of a data management method for a storage device according to the first preferred embodiment.
Figure 3B:
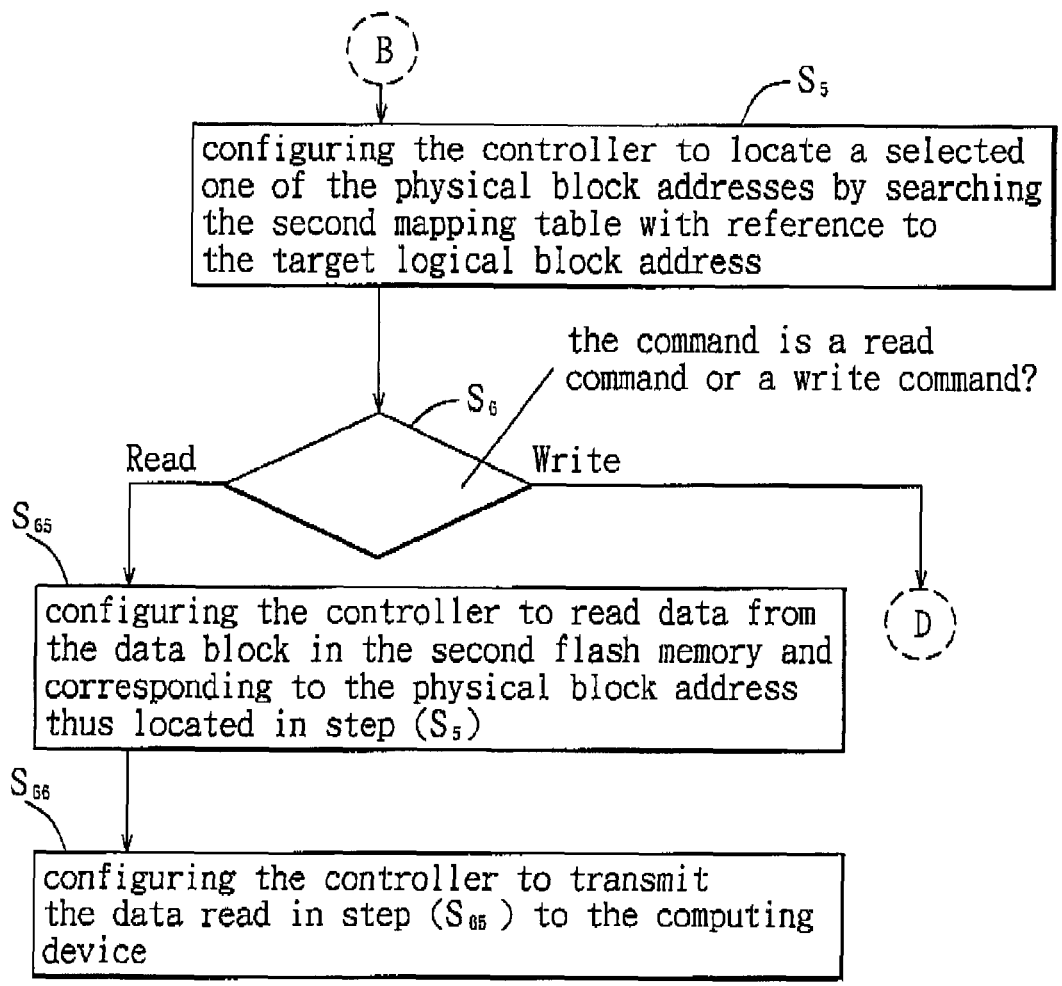
Figure 3C:
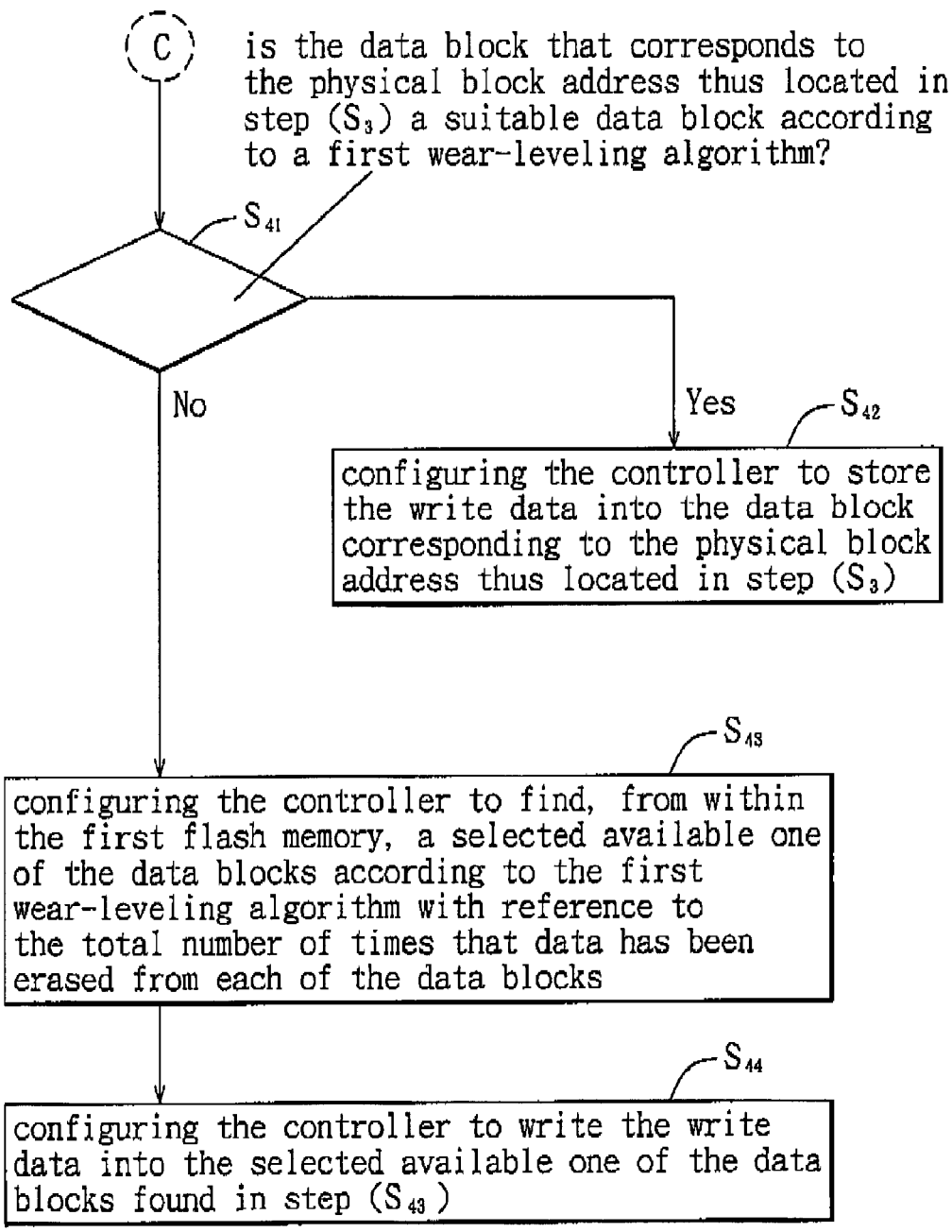
Figure 3D:
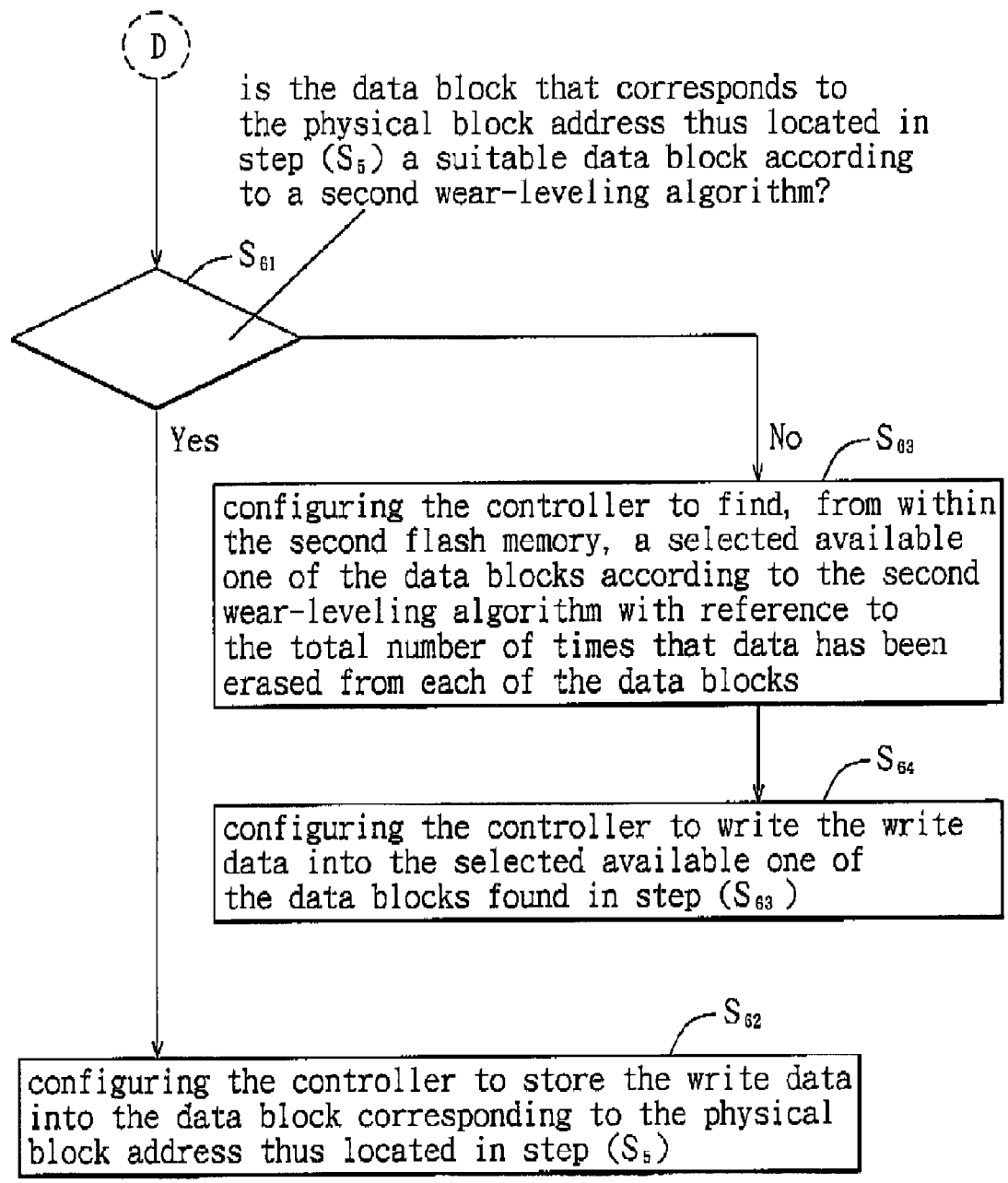

With reference to FIG. 1 and FIG. 2, a storage device 1 according to the first preferred embodiment of the present invention includes a flash memory module 2 and a processing module 3. In this embodiment, the flash memory module 2 includes a first flash memory 21 and a second flash memory 22.

The first flash memory 21 is a first flash memory type, and includes a first number (m) of data blocks 20. The first number (m) is a positive integer that is greater than one. The second flash memory is a second flash memory type that is different from the first flash memory type, and includes a second number (n) of data blocks 20. The second number (n) is a positive integer that is greater than one. Each of the data blocks 20 of the first flash memory 21 includes a plurality of first memory cells (i.e., transistors). Each of the data blocks 20 of the second flash memory 22 includes a plurality of second memory cells (i.e., transistors). A memory capacity of each of the first memory cells is different from that of each of the second memory cells.

In this embodiment, the number of the first memory cells included in each data block 20 of the first flash memory 21 is equal to the number of the second memory cells included in each data block 20 of the second flash memory 22. Moreover, the first flash memory 21 is a single-level cell (SLC) type flash memory, and the second flash memory 22 is a multi-level cell (MLC) type flash memory that is capable of storing 4 bits of data per cell. In other words, the memory capacity of each of the second memory cells is four times that of each of the first memory cells. It should be noted herein that the first and second flash memories 21, 22 do not have to respectively be the SLC type and MLC type flash memories in other embodiments of the present invention. Moreover, the ratio between the memory capacities of the first memory cell and the second memory cell should not be limited to that disclosed herein.

Each of the data blocks 20 of the first and second flash memories 21, 22 corresponds to a physical block address (PBA) and a logical block address (LBA). The physical block addresses that correspond to the data blocks 20 of the first flash memory 21 are denoted by $(P_0 \sim P_{m-1})$, and the logical block addresses that correspond to the data blocks 20 of the first flash memory 21 are denoted by $(L_0 \sim L_{m-1})$. The physical block addresses that correspond to the data blocks 20 of the second flash memory 22 are denoted by $(P_m \sim P_{m+n-1})$, and the logical block addresses that correspond to the data blocks 20 of the first flash memory 21 are denoted by $(L_m \sim L_{m+n-1})$.

The processing module 3 is coupled to the flash memory module 2, and includes a storage unit 31 and a controller 32 coupled to the storage unit 31. The storage unit 31 has a first mapping table 311 and a second mapping table 312 recorded therein. The first mapping table 311 corresponds to the first flash memory 21 and records the physical block addresses $(P_0 \sim P_{m-1})$ and the logical block addresses $(L_0 \sim L_{m-1})$ that correspond to the data blocks 20 of the first flash memory 21. The second mapping table 312 corresponds to the second flash memory 22 and records the physical block addresses $(P_m \sim P_{m+n-1})$ and the logical block addresses $(L_m \sim L_{m+n-1})$ that correspond to the data blocks 20 of the second flash memory 22. As illustrated in FIG. 2, each of the first and second mapping tables 311, 312 includes two columns, namely a column for the logical block addresses and a column for the physical block addresses.

It should be noted herein that, in practice, the first and second flash memories 21, 22 may each have a memory space dedicated for recording the corresponding one of the first and second mapping tables 311, 312 therein, in which case the processing module would not have the storage unit 31. Therefore, the present invention is not limited to the particular implementation disclosed herein.

With further reference to FIGS. 3A-3D, when the storage device 1 is turned on, step $(S_1)$ of a data management method according to the present invention is performed, in which the controller 32 is configured to establish each of the first and second mapping tables 311, 312. In particular, the controller 32 is configured to establish each of the first and second mapping tables 311, 312 by reading and storing initial values of the physical block address $(P_0 \sim P_{m+n-1})$ and the logical block address $(L_0 \sim L_{m+n-1})$ that are stored in each of the data blocks 20 in the corresponding one of the first and second flash memories 21, 22.

In this embodiment, the controller 32 is further configured to keep track, for each of the data blocks 20 of each of the first and second flash memories 21, 22, of a total number of times that data has been erased therefrom. Each of the first and second mapping tables 311, 312 may further has a column for storing the total number of times that data has been erased from each of the data blocks 20 of the corresponding one of the first and second flash memories 21. Alternatively, for each of the first and second flash memories 21, there may be another table for storing the total number of times that data has been erased from each of the data blocks 20 thereof.

Subsequently, the flow goes to step $(S_2)$, where the controller 32 of the processing module 3 is configured to determine, upon receipt of a command that contains a target logical block address $(L_T)$ therein and that is transmitted by a computing device 4 (see FIG. 1) coupled electrically to the storage device 1, a selected one of the first and second flash memories 21, 22 according to the target logical block address $(L_T)$. In particular, since it is known that the logical block addresses $(L_0 \sim L_{m-1})$ correspond to the first flash memory 21, and the logical block addresses $(L_m \sim L_{m+n-1})$ correspond to the second flash memory 22, the controller 32 may determine which one of the first and second flash memories 21, 22 the target logical block address $(L_T)$ corresponds to by comparing the subscript (T) with the first number (m). If the first flash memory 21 is selected in step $(S_2)$, the flow goes to step $(S_3)$, and if the second flash memory 22 is selected in step $(S_2)$, the flow goes to step $(S_5)$.

In step $(S_3)$, the controller 32 is configured to locate a selected one of the physical block addresses $(P_0 \sim P_{m-1})$ by searching the first mapping table 311 with reference to the target logical block address $(L_T)$. For instance, with reference to FIG. 2, assuming that the target logical block address $(L_T)$ is $(L_{600})$, then the selected one of the physical block addresses $(P_0 \sim P_{m-1})$ is $(P_{300})$.

Subsequently, in step $(S_4)$, the controller 32 is configured to determine whether the command is a read command or a write command, the latter including a write data in addition to the target logical block address $(L_T)$. If it is determined in step $(S_4)$ that the command is a write command, the flow goes to step $(S_{41})$.

In step $(S_{41})$, the controller 32 is configured to determine whether the data block 20 in the first flash memory 21 and corresponding to the physical block address thus located in step $(S_3)$, i.e., $(P_{300})$ in the previous example, is a suitable data block according to a first wear-leveling algorithm. The first wear-leveling algorithm is one that aims at making the total numbers of times that data has been erased even among the data blocks 20 in the first flash memory 21. It is noted herein that there are currently many wear-leveling algorithms, and the present invention is not limited to any particular wear-leveling algorithm. If it is determined in step $(S_{41})$ that the data block 20 corresponding to the physical block address thus located in step $(S_3)$ (i.e., $(P_{300})$) is a suitable data block, the flow goes to step $(S_{42})$, where the controller 32 is configured to store the write data into the data block 20 corresponding to the physical block address thus located in step $(S_3)$.

If it is determined in step $(S_{41})$ that the data block 20 corresponding to the physical block address thus located in step $(S_3)$ (i.e., $(P_{300})$) is not a suitable data block, the flow goes to step $(S_{43})$, where the controller 32 is configured to find, from within the first flash memory 21, a selected available one of the data blocks 20 according to the first wear-leveling algorithm with reference to the total number of times that data has been erased from each of the data blocks 20.

Subsequently, in step ($S_{44}$), the controller 32 is configured to write the write data into the selected available one of the data blocks 20 found in step ($S_{43}$) and to set, in the first mapping table 311, the physical block address of the selected available one of the data blocks 20 to correspond to the target logical block address ($L_T$) in the command.

If it is determined in step ($S_4$) that the command is a read command, the flow goes to step ($S_{45}$), where the controller 32 is configured to read data from the data block 20 in the first flash memory 21 and corresponding to the physical block address thus located in step ($S_3$). Next, in step ($S_{46}$), the controller 32 is configured to transmit the data read in step ($S_{45}$) to the computing device 4.

If the second flash memory 22 is selected in step ($S_2$), the flow goes to step ($S_5$), where, similar to step ($S_3$), the controller 32 is configured to locate a selected one of the physical block addresses ($P_m \sim P_{m+n-1}$) by searching the second mapping table 312 with reference to the target logical block address ($L_T$). Subsequently, in step ($S_6$), the controller 32 is configured to determine whether the command is a read command or a write command, the latter including a write data in addition to the target logical block address ($L_T$). If it is determined in step ($S_6$) that the command is a write command, the flow goes to step ($S_{61}$).

In step ($S_{61}$), the controller 32 is configured to determine whether the data block 20 in the second flash memory 22 and corresponding to the physical block address thus located in step ($S_5$) is a suitable data block according to a second wear-leveling algorithm. The second wear-leveling algorithm may be the same as or different from the first wear-leveling algorithm. If it is determined in step ($S_{61}$) that the data black 20 corresponding to the physical block address thus located in step ($S_5$) is a suitable data block, the flow goes to step ($S_{62}$), where the controller 32 is configured to store the write data into the data block 20 corresponding to the physical block address thus located in step ($S_5$). If it is determined in step ($S_{61}$) that the data block 20 corresponding to the physical block address thus located in step ($S_5$) is not a suitable data block, the flow goes to step ($S_{63}$), where the controller 32 is configured to find, from within the second flash memory 22, a selected available one of the data blocks 20 according to the second wear-leveling algorithm with reference to the total number of times that data has been erased from each of the data blocks 20. Subsequently, in step ($S_{64}$), the controller 32 is configured to write the write data into the selected available one of the data blocks 20 found in step ($S_{63}$), and to set, in the second mapping table 312, the physical block address of the selected available one of the data blocks 20 to correspond to the target logical block address ($L_T$) in the command.

If it is determined in step ($S_6$) that the command is a read command, the flow goes to step ($S_{65}$), where the controller 32 is configured to read data from the data block 20 in the second flash memory 22 and corresponding to the physical block address thus located in step ($S_5$). Next, in step ($S_{66}$), the controller 32 is configured to transmit the data read in step ($S_{65}$) to the computing device 4.

Figure 4:
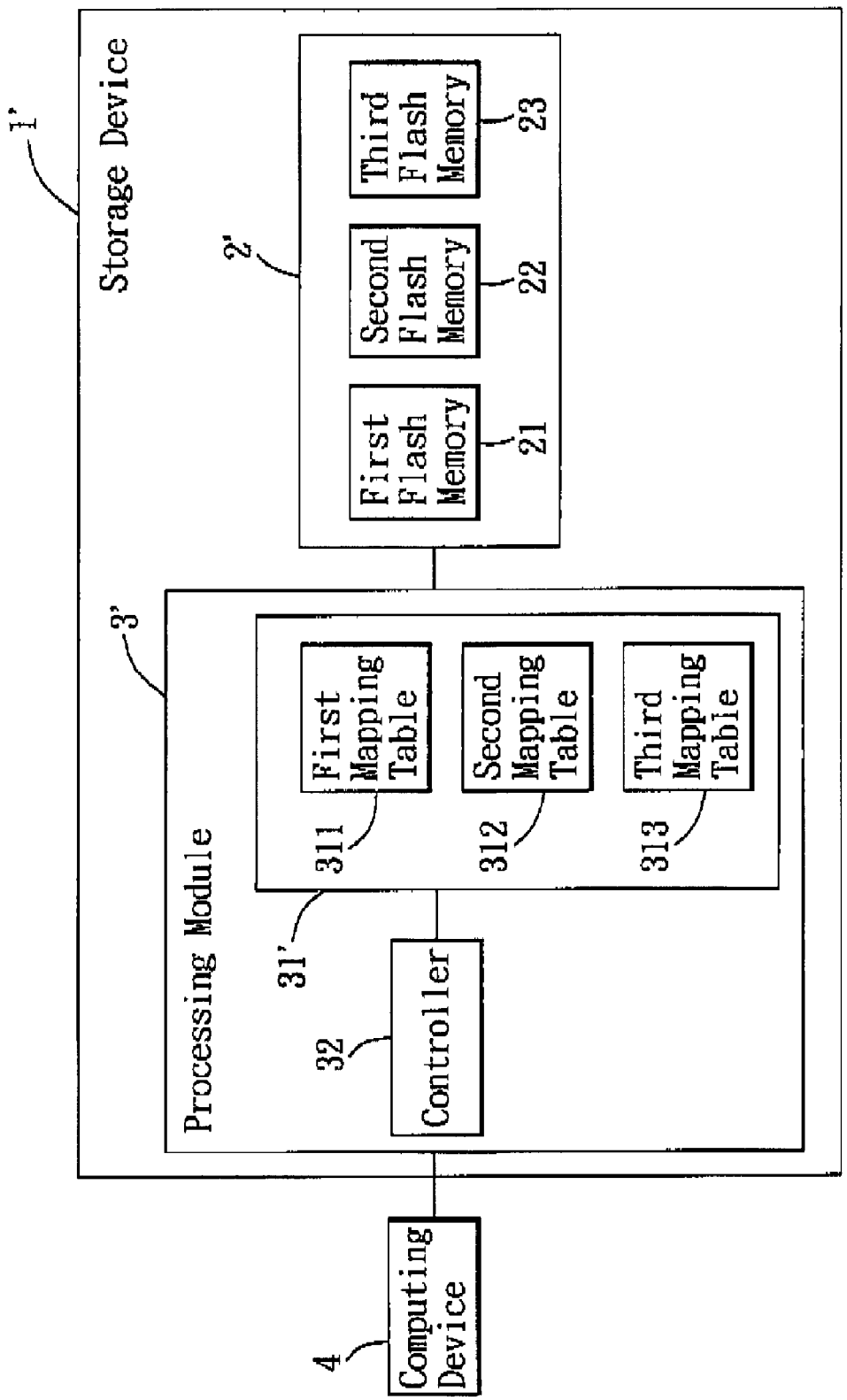
FIG. 4 is a block diagram of a storage device according to the second preferred embodiment of the present invention.

It should be noted herein that the flash memory module 2 is not limited to including only two flash memories in other embodiments of the present invention. For example, as shown in FIG. 4, the storage device 1' according to the second preferred embodiment of the present invention differs from the storage device 1 of the first preferred embodiment in that the flash memory module 2' of the second preferred embodiment further includes a third flash memory 23 and that the storage unit 31' of the processing module 3' of the second preferred embodiment further records a third mapping table 313 therein. The third flash memory 23 includes a third number of data blocks (not shown). The third number is a positive integer that is greater than one. As with the first and second flash memories 21, 22, each of the data blocks of the third flash memory 23 corresponds to a physical block address (PBA) and a logical block address (LBA). The third mapping table 313 corresponds to the third flash memory 23, and records the physical block addresses and the logical block addresses that correspond to the data blocks of the third flash memory 23. In the second preferred embodiment, the first flash memory 21 is a single-level cell (SLC) type flash memory, and each of the second and third flash memories 22, 23 is a multi-level cell (MLC) type flash memory. The storage capacity of the second flash memory 22 differs from that of the third flash memory 23.

Since the principles of data management for the storage device 1' of the second preferred embodiment are identical to those described above in connection with the first preferred embodiment, further details of the same are omitted herein for the sake of brevity.

It should be noted herein that, in other embodiments of the present invention, the order of execution of some of the steps May be interchanged without departing from the principles of the present invention. For example, the steps of ($S_3$) and ($S_5$), where a selected physical block address is located with reference to the target logical block address ($L_T$) may be performed prior to the step of ($S_4$), where it is determined whether the command is a read command or a write command.

In summary, the present invention utilizes individual mapping tables for managing different types of flash memories of a storage device such that data to be written into the storage device is stored in a data block having a physical block address that corresponds to a target logical block address. As compared with conventional data management techniques, due to the use of a single mapping table for a corresponding single flash memory in the storage device, the present invention takes into consideration the differences among the flash memories such that data corresponding to a single file is written into one of the flash memories in the storage device, instead of being distributed among the different flash memories of different types and with different characteristics, such as access speed, so as to ensure good operating efficiency of the storage device.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A storage device comprising:
   a first flash memory being a first flash memory type, and including a first number of data blocks, the first number being a positive integer that is greater than one;
   a second flash memory being a second flash memory type that is different from the first flash memory type, and including a second number of data blocks, the second number being a positive integer that is greater than one, each of said data blocks of said first and second flash memories corresponding to a physical block address and a logical block address; and
   a processing module including a controller, said controller being capable of accessing a first mapping table and a second mapping table, said first mapping table corresponding to said first flash memory and recording said physical block addresses and said logical block addresses that correspond to said data blocks of said first flash memory, said second mapping table corresponding to said second flash memory and recording said physical block addresses and said logical block addresses that correspond to said data blocks of said second flash memory;

wherein said controller of said processing module is configured to determine, upon receipt of a command that contains a target logical block address therein, a selected one of said first and second flash memories according to the target logical block address, and to locate a selected one of the physical block addresses by searching one of said first and second mapping tables that corresponds to the selected one of said first and second flash memories with reference to the target logical block address.

2. The storage device as claimed in claim 1, wherein each of said data blocks of said first flash memory includes a plurality of first memory cells, each of said data blocks of said second flash memory including a plurality of second memory cells, a memory capacity of each of said first memory cells being different from that of each of said second memory cells.

3. The storage device as claimed in claim 2, wherein said first flash memory is a single-level cell (SLC) type flash memory, and said second flash memory is a multi-level cell (MLC) type flash memory.

4. The storage device as claimed in claim 2, further comprising a third flash memory that includes a third number of data blocks, the third number being a positive integer that is greater than one, each of said data blocks of said third flash memory corresponding to a physical block address and a logical block address, said storage unit further having a third mapping table recorded therein, said third mapping table corresponding to said third flash memory and recording said physical block addresses and said logical block addresses that correspond to said data blocks of said third flash memory.

5. The storage device as claimed in claim 4, wherein said first flash memory is a single-level cell (SLC) type flash memory, each of said second and third flash memories being a multi-level cell (MLC) type flash memory, a storage capacity of said second flash memory differing from that of said third flash memory.

6. The storage device as claimed in claim 1, the command being a write command that contains the target logical block address and a write data, wherein said controller is further configured to keep track, for each of said data blocks of each of said first and second flash memories, of a total number of times that data has been erased therefrom, and is further configured to find, upon receipt of the command, from within the selected one of said first and second flash memories as determined according to the target logical block address in the command, a selected available one of said data blocks according to an wear-leveling algorithm with reference to the total number of times that data has been erased from each of said data blocks, said controller being further configured to write the write data into the selected one of said data blocks, and to set, in the selected one of said first and second mapping tables, the physical block address of the selected available one of said data blocks to correspond to the target logical block address in the command.

7. The storage device as claimed in claim 1, wherein the first and second mapping tables are respectively stored in said first and second flash memories.

8. A data management method for a storage device, comprising the steps of:
(a) upon receipt of a write command that contains a target logical block address and a write data, configuring a controller to determine a selected one of a plurality of flash memories of the storage device according to the target logical block address;
(b) configuring the controller to find a selected one of a plurality of mapping tables that corresponds to the selected one of the flash memories, each of the mapping tables indicating corresponding relationships between a physical block address and a logical block address of each of a plurality of data blocks in the corresponding one of the flash memories;
(c) configuring the controller to locate the physical block address that corresponds to the target logical block address by searching the selected one of the mapping table thus found in step (b); and
(d) configuring the controller to store the write data into the data block in the selected one of the flash memories and corresponding to the physical block address thus located in step (c).

9. The data management method as claimed in claim 8, further comprising the step of, prior to step (a): (e) configuring the controller to establish each of the mapping tables.

10. The data management method as claimed in claim 9, wherein, in step (e), the controller is configured to establish each of the mapping tables by reading and storing initial values of the physical block address and the logical block address that are stored in each of the data blocks in the corresponding one of the flash memories.

11. The data management method as claimed in claim 9, further comprising the step of, between step (c) and step (d): (f) configuring the controller to determine whether the data block in the selected one of the flash memories and corresponding to the physical block address thus located in step (c) is a suitable data block according to an wear-leveling algorithm;

wherein step (d) is only performed when it is determined in step (f) that the data block in the selected one of the flash memories and corresponding to the physical block address thus located in step (c) is the suitable data block; and wherein the data management method further comprises the steps of
(g) when it is determined in step (f) that the data block in the selected one of the flash memories and corresponding to the physical block address thus located in step (c) is not a suitable data block, configuring the controller to find, from within the selected one of said first and second flash memories, a selected available one of said data blocks according to the wear-leveling algorithm with reference to total number of times that data has been erased from each of the data blocks, and
(h) configuring the controller to write the write data into the selected available one of said data blocks, and to set, in the selected one of the mapping tables, the physical block address of the selected available one of the data blocks to correspond to the target logical block address in the write command.

12. The data management method as claimed in claim 11, further comprising the step of: (i) configuring the controller to keep track, for each of the data blocks of each of the flash memories, of the total number of times that data has been erased therefrom, and to store the total number of times to correspond to the physical block address and the logical block address of the corresponding one of the data blocks of the corresponding one of the flash memories in the corresponding one of the mapping tables.

13. A data management method for a storage device, comprising the steps of:
   (a) upon receipt of a read command that contains a target logical block address, configuring a controller to determine a selected one of a plurality of flash memories of the storage device according to the target logical block address;
   (b) configuring the controller to find a selected one of a plurality of mapping tables that corresponds to the selected one of the flash memories, each of the mapping tables indicating relationships between a physical block address and a logical block address of each of a plurality of data blocks in the corresponding one of the flash memories;
   (c) configuring the controller to locate the physical block address that corresponds to the target logical block address by searching the mapping table thus found in step (b); and
   (d) configuring the controller to read data from the data block in the selected one of the flash memories and corresponding to the physical block address thus located in step (c).

* * * * *